United States Patent
Cho et al.

(10) Patent No.: US 11,294,290 B2
(45) Date of Patent: Apr. 5, 2022

(54) RETICLE FABRICATION METHOD AND SEMICONDUCTOR DEVICE FABRICATION METHOD INCLUDING THE SAME

(71) Applicant: SAMSUNG ELECTRONICS CO., LTD., Suwon-si (KR)

(72) Inventors: Woo-Yong Cho, Hwaseong-si (KR); Sangwook Kim, Yongin-si (KR); Jaewon Yang, Suwon-si (KR)

(73) Assignee: SAMSUNG ELECTRONICS CO., LTD.

( * ) Notice: Subject to any disclaimer, the term of this patent is extended or adjusted under 35 U.S.C. 154(b) by 49 days.

(21) Appl. No.: 16/911,819

(22) Filed: Jun. 25, 2020

(65) Prior Publication Data
US 2021/0165333 A1    Jun. 3, 2021

(30) Foreign Application Priority Data
Dec. 2, 2019    (KR) .................. 10-2019-0158181

(51) Int. Cl.
*G03F 7/20*     (2006.01)
*H01L 21/308*   (2006.01)
*H01L 21/027*   (2006.01)

(52) U.S. Cl.
CPC ...... *G03F 7/70633* (2013.01); *G03F 7/70033* (2013.01); *G03F 7/7065* (2013.01);
(Continued)

(58) Field of Classification Search
CPC ............. G03F 7/70033; G03F 7/70625; G03F 7/70633; G03F 7/7065; G03F 1/70;
(Continued)

(56) References Cited

U.S. PATENT DOCUMENTS 6,883,158 B1 *   4/2005   Sandstrom ............. G03F 7/704
                                                     430/5
7,300,729 B2 *  11/2007   Watson ..................... G03F 1/38
                                                     382/144
(Continued)

FOREIGN PATENT DOCUMENTS

JP    2001-66759 A    3/2001
JP    2007-156027 A   6/2007
(Continued)

*Primary Examiner* — Deoram Persaud
(74) *Attorney, Agent, or Firm* — Myers Bigel, P.A.

(57) ABSTRACT

Disclosed are reticle fabrication methods and semiconductor device fabrication methods. The reticle fabrication method includes performing a photolithography process on a test substrate using a first reticle having first patterns, measuring the test substrate to obtain measured images, designing a second reticle having second patterns, redesigning the second reticle based on a margin of the photolithography process, and manufacturing the redesigned second reticle. Redesigning the second reticle includes obtaining sample images from the measured images when the first patterns are the same as the second patterns, obtaining contour images that have contours of sample patterns in the sample images, overlapping the contours to obtain a contour overlay value, and comparing the contour overlay value with a reference value to determine defects of the second patterns.

21 Claims, 11 Drawing Sheets

(52) U.S. Cl.
CPC ...... *G03F 7/70625* (2013.01); *H01L 21/0274* (2013.01); *H01L 21/3086* (2013.01)

(58) Field of Classification Search
CPC . G03F 7/705; G03F 7/70616; H01L 21/0274; H01L 21/3086
See application file for complete search history.

(56) References Cited

U.S. PATENT DOCUMENTS

| | | | |
|---|---|---|---|
| 8,023,723 B2 | 9/2011 | Ito | |
| 8,046,722 B2 * | 10/2011 | Kotani | G03F 1/36 716/50 |
| 8,799,830 B2 | 8/2014 | Robles | |
| 9,934,346 B2 | 4/2018 | Hansen | |
| 2005/0134866 A1 | 6/2005 | Kyoh et al. | |
| 2017/0052452 A1 * | 2/2017 | Mailfert | G03F 1/70 |
| 2019/0147134 A1 | 5/2019 | Wang et al. | |

FOREIGN PATENT DOCUMENTS

| | | |
|---|---|---|
| JP | 4357287 B2 | 11/2009 |
| JP | 4856047 B2 | 1/2012 |
| JP | 4900013 B2 | 3/2012 |
| JP | 2016-21008 A | 2/2016 |

\* cited by examiner

RETICLE FABRICATION METHOD AND SEMICONDUCTOR DEVICE FABRICATION METHOD INCLUDING THE SAME

CROSS-REFERENCE TO RELATED APPLICATION

This U.S. nonprovisional application claims priority under 35 U.S.C § 119 to Korean Patent Application No. 10-2019-0158181 filed on Dec. 2, 2019 in the Korean Intellectual Property Office, the disclosure of which is hereby incorporated by reference in its entirety.

BACKGROUND

The present inventive concepts relate to a semiconductor device fabrication method, and more particularly, to a reticle fabrication method and a semiconductor device fabrication method including the same.

With the advancement of information technology, research and development for highly-integrated semiconductor devices are actively being conducted. Integration of semiconductor devices may be determined by the wavelength of a light source for photolithography. The light source may include an excimer laser source, such as I-line, G-line, KrF, and ArF, and/or an extreme ultraviolet (EUV) light source whose wavelength is shorter than that of the excimer laser source. The EUV light source may produce energy much larger than that of the excimer laser source.

SUMMARY

Some example embodiments of the present inventive concepts provide a reticle fabrication method for eliminating or minimizing defects and a semiconductor device fabrication method including the same.

According to some example embodiments of the present inventive concepts, a reticle fabrication method may include performing a photolithography process on a test substrate using a first reticle having first patterns, measuring the test substrate to obtain measured images, designing a second reticle having second patterns, redesigning the second reticle based on a margin of the photolithography process to determine a redesigned second reticle, and manufacturing the redesigned second reticle. The redesigning the second reticle may include obtaining sample images from the measured images when the first patterns are same as the second patterns, obtaining contour images that have contours of sample patterns in the sample images, overlapping the contours to obtain a contour overlay value, and comparing the contour overlay value with a reference value to determine whether defects of the second patterns are present.

According to some example embodiments of the present inventive concepts, a reticle fabrication method may include performing a photolithography process on a test substrate using a first reticle having first patterns, measuring the test substrate to obtain measured images, designing a second reticle having second patterns, and redesigning the second reticle based on a margin of the photolithography process to determine a redesigned second reticle. The redesigning the second reticle may include obtaining sample images from the measured images when the first patterns are same as the second patterns, obtaining contour images that have contours of sample patterns in the sample images, and overlapping the contour images to obtain a global overlay value.

According to some example embodiments of the present inventive concepts, a semiconductor device fabrication method may include performing a first photolithography process on a test substrate using a first reticle having first patterns, measuring the test substrate to obtain measured images; designing a second reticle having second patterns, redesigning the second reticle based on a margin of the first photolithography process to determine a redesigned second reticle, manufacturing the redesigned second reticle, and performing a second photolithography process on a substrate using the second reticle. The redesigning the second reticle may include obtaining sample images from the measured images when the first patterns are same as the second patterns, obtaining contour images that have contours of sample patterns in the sample images, overlapping the contours to obtain a contour overlay value, and comparing the contour overlay value with a reference value to determine whether defects of the second patterns are present.

DETAILED DESCRIPTION

Figure 1:
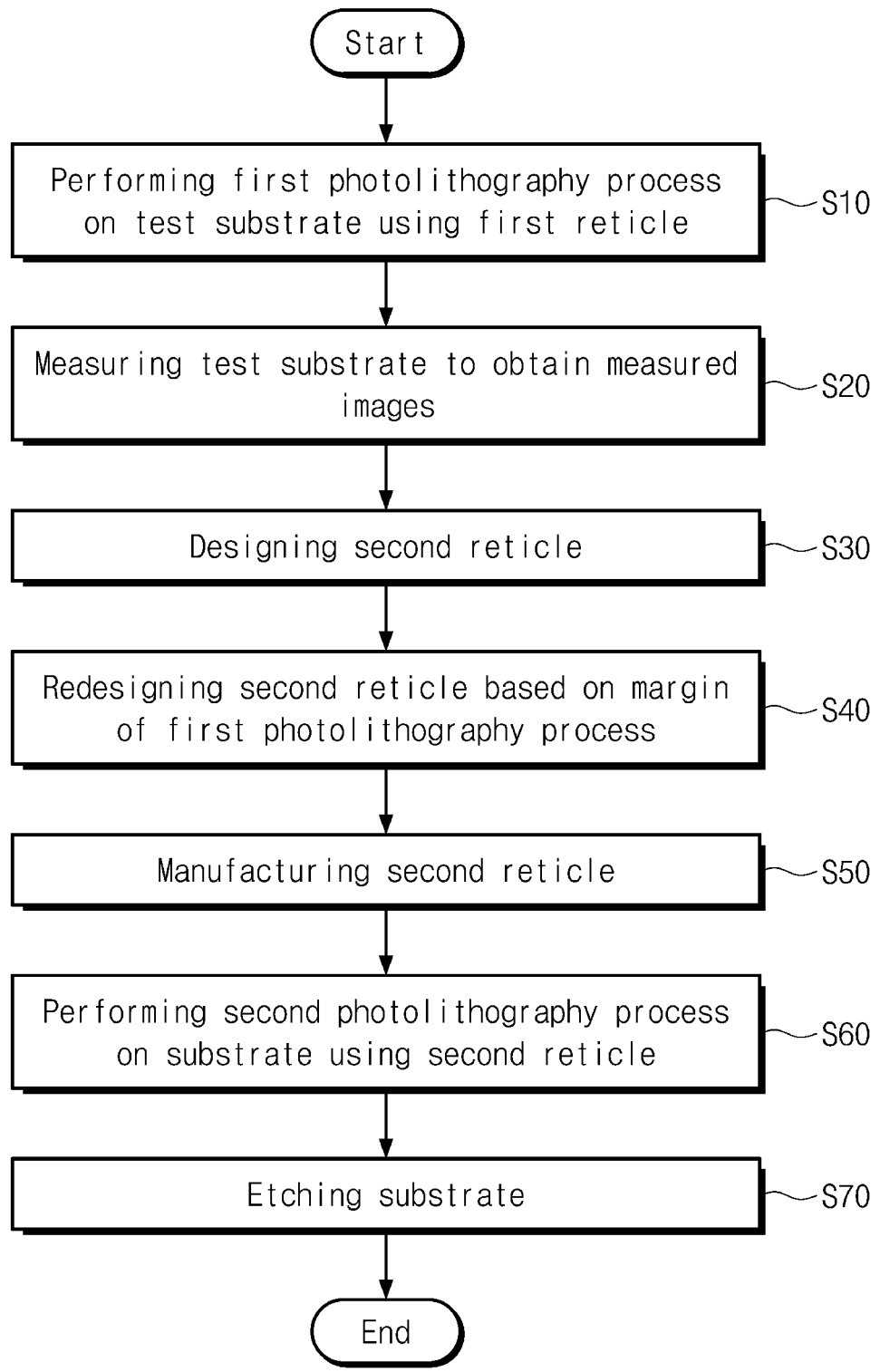
FIG. 1 illustrates a flow chart showing an example of a semiconductor device fabrication method according to the present inventive concepts.
Figure 2:
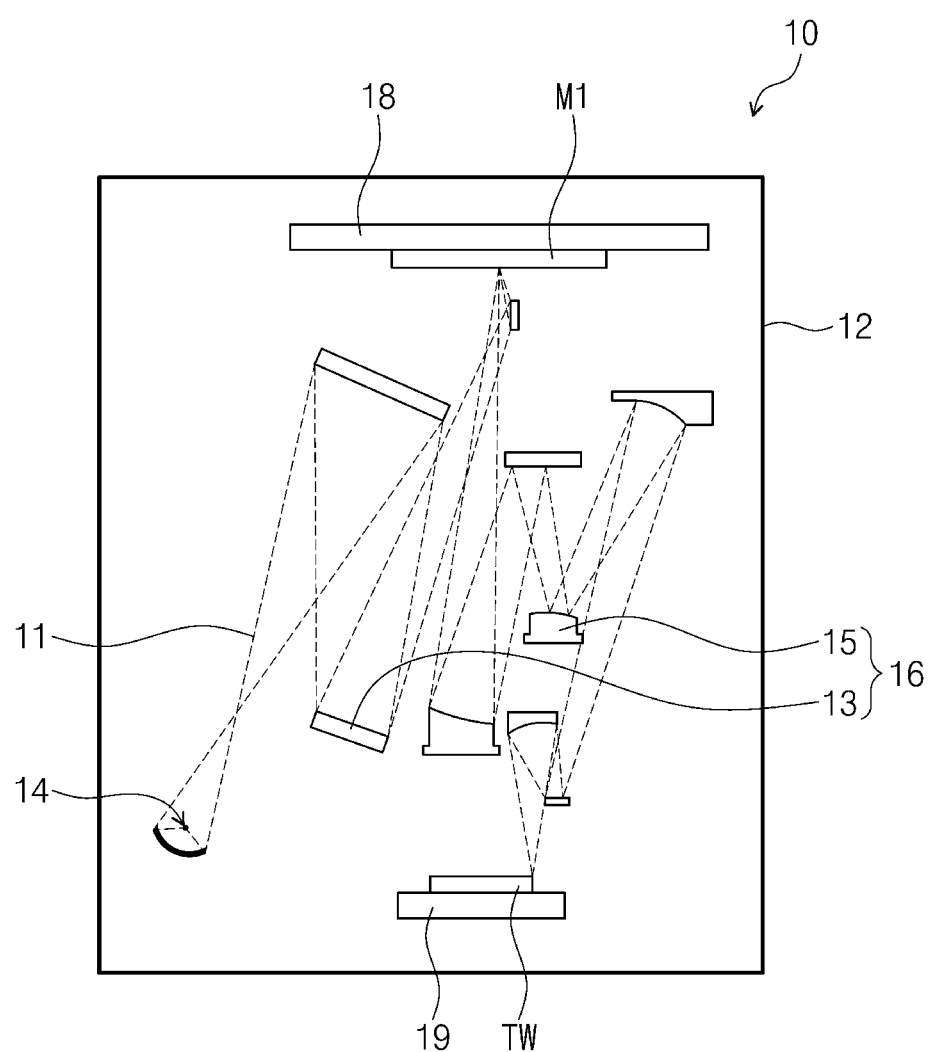
FIG. 2 illustrates a schematic diagram showing an example of a photolithography apparatus.

FIG. 1 shows an example of a semiconductor device fabrication method according to the present inventive concepts. FIG. 2 shows an example of a photolithography apparatus 10.

FIGS. 1 and 2, the photolithography apparatus 10 may perform a first photolithography process on a test substrate TW using a first reticle M1 (S10). For example, the photolithography apparatus 10 may include an extreme ultraviolet radiation (EUV) exposure apparatus and a spinner apparatus. The first photolithography process may include an EUV exposure process. In some embodiments, the photolithography apparatus 10 may include an ArF or KrF exposure apparatus, but the present inventive concepts are not limited thereto. For example, the photolithography apparatus 10 for EUV exposure may include a chamber 12, an EUV source 14, an optical system 16, a reticle stage 18, and/or a first substrate stage 19.

The chamber 12 may provide the test substrate TW and the first reticle M1 with a space isolated from the external environment. For example, the chamber 12 may have a vacuum pressure ranging from about $1 \times 10^{-4}$ Torr to about $1 \times 10^{-6}$ Torr.

The EUV source 14 may be disposed in one side of the chamber 12. The EUV source 14 may generate an EUV beam 11. The EUV beam 11 may be a plasma beam. For example, the EUV source 14 may provide an optically pumped light (e.g., a laser beam) to liquid metal droplets of tin (Sn), xenon (Xe) gases, titanium (Ti), or lithium (Li), thereby generating the EUV beam 11. The EUV beam 11 may have a wavelength of about 13.5 nm. The EUV source 14 may provide the optical system 16 with the EUV beam 11.

The optical system 16 may be disposed between the reticle stage 18 and the first substrate stage 19. The optical system 16 may provide the EUV beam 11 to the first reticle M1 and the test substrate TW in the foregoing sequence. For example, the optical system 16 may include illumination mirrors 13 and projection mirrors 15. The illumination mirrors 13 may be disposed between the EUV source 14 and the reticle stage 18. The illumination mirrors 13 may provide the first reticle M1 with the EUV beam 11. The projection mirrors 15 may receive the EUV beam 11 reflected from the first reticle M1. The projection mirrors 15 may be disposed between the reticle stage 18 and the first substrate stage 19. The projection mirrors 15 may reflect the EUV beam 11 toward the test substrate TW.

Figure 3:
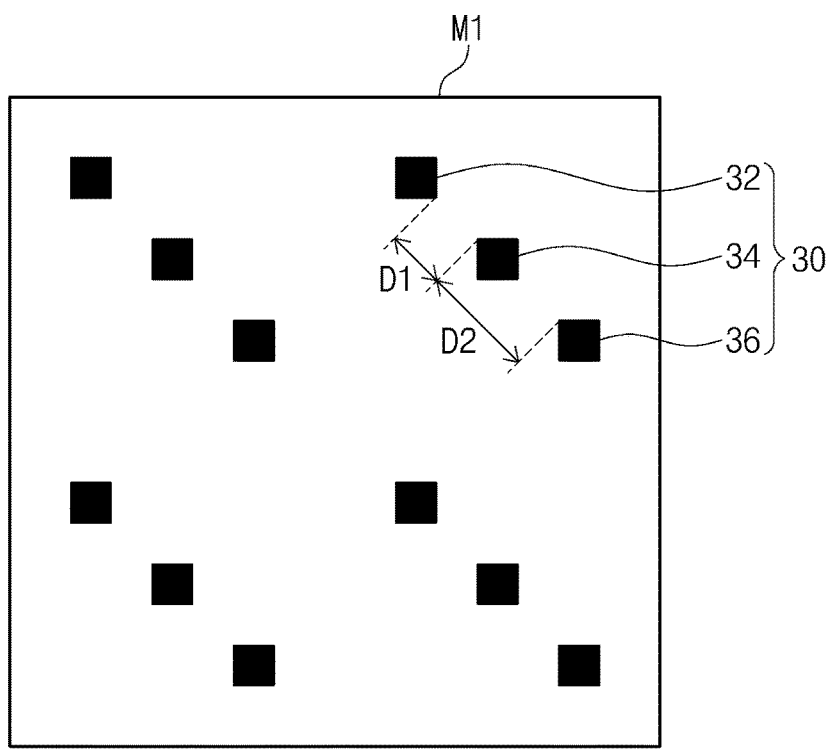
FIG. 3 illustrates a plan view showing an example of a first reticle in FIG. 2.

FIG. 3 shows an example of the first reticle M1 in FIG. 2.

Referring to FIG. 3, the first reticle M1 may be a reference reticle or a reference photomask. For example, the first reticle M1 may include first patterns 30. The first patterns 30 may be test patterns. For example, each of the first patterns 30 may have a tetragonal shape. The first patterns 30 may have their reflective layers for reflecting the EUV beam 11. For example, the first patterns 30 may include a first test pattern 32, a second test pattern 34, and a third test pattern 36. Each of the first patterns 30 may be one of the first, second, and/or third test patterns 32, 34, and 36. The first test pattern 32, the second test pattern 34 and/or the third test pattern 36 may be different from each other in shape, size, and/or other parameters. The first test pattern 32 may be a first reference pattern. The second test pattern 34 may be disposed adjacent to the first test pattern 32. The second test pattern 34 may be spaced apart at a first distance D1 from the first test pattern 32. The third test pattern 36 may be disposed adjacent to the second test pattern 34. The third test pattern 36 may be spaced apart at a second distance D2 from the first test pattern 32.

Referring back to FIG. 2, the reticle stage 18 may be installed in an upper portion of the chamber 12. The reticle stage 18 may be disposed between the illumination mirrors 13 and the projection mirrors 15, from the perspective of the EUV beam 11. The reticle stage 18 may hold the first reticle M1. The reticle stage 18 may drive the first reticle M1 to move in a direction parallel to the test substrate TW in an exposure process that employs the EUV beam 11.

The first substrate stage 19 may be installed in a lower portion of the chamber 12. The first substrate stage 19 may receive and hold the test substrate TW. The first substrate stage 19 and the reticle stage 18 may be parallel to each other. When the reticle stage 18 drives the first reticle M1 to move, the first substrate stage 19 may drive the test substrate TW to move in a direction the same as or opposite to the moving direction of the first reticle M1, thereby scanning the EUV beam 11 on the test substrate TW. The EUV beam 11 may photosensitize a photoresist on the test substrate TW, in accordance with the first patterns 30 of the first reticle M1 as illustrated in FIG. 3. When the EUV beam 11 allows the first patterns 30 to be projected to fine sizes of about several to tens of nano-meters, an amount (intensity) of the EUV beam 11 or the number of photons of the EUV beam 11 provided to the photoresist may be reduced to about ten times an amount (intensity) of a typical ArF or KrF beam or the number of photons of the ArF or KrF beam. A spinner apparatus (not shown) may develop the photosensitized photoresist into a photoresist pattern. Owing to the reduction in the amount (intensity) or in the number of photons, the EUV beam 11 may generate a shot noise for the photoresist pattern.

Figure 4:
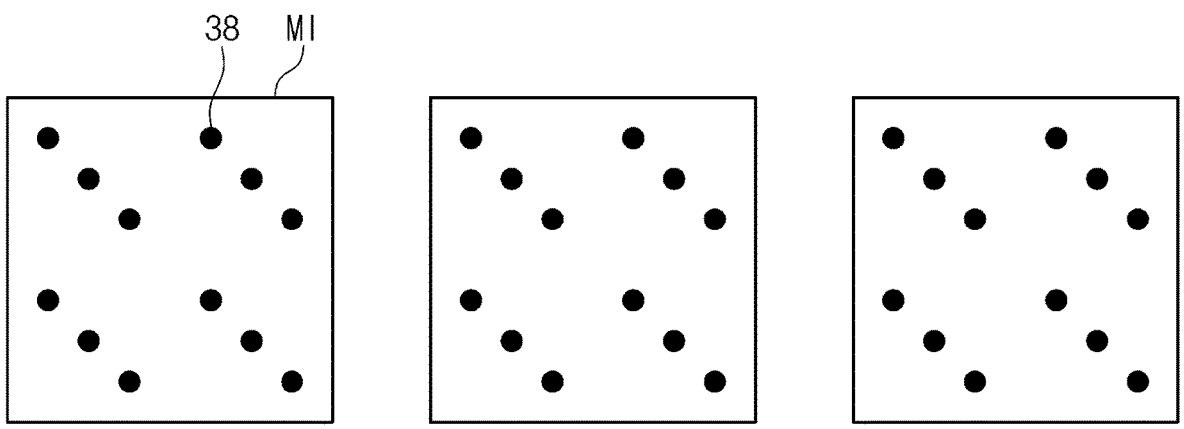
FIG. 4 illustrates measured images formed by the first reticle of FIG. 3.

FIG. 4 shows measured images MI formed by the first reticle M1 of FIG. 3.

Referring to FIGS. 1 and 4, a measurement apparatus may measure the test substrate TW to obtain the measured images MI (S20). The measurement apparatus may be, for example, a scanning electron microscope (SEM). The measured images MI may be after-development images (ADI). The measured images MI may have, for example, first pattern images 38. The first pattern image 38 may have an area less than that of the first pattern 30. For example, the area of the first pattern 30 may be about four times greater than that of the first pattern image 38. The first pattern image 38 may be obtained from a hole-shaped photoresist pattern. The first pattern images 38 may have high dispersion and low uniformity due to the shot noise of the EUV beam 11. When an etching process uses the photoresist pattern as an etching mask to etch the test substrate TW, the measurement apparatus may measure the etched test substrate TW to obtain the measured images MI as after-cleaning images (ACI).

Figure 5:
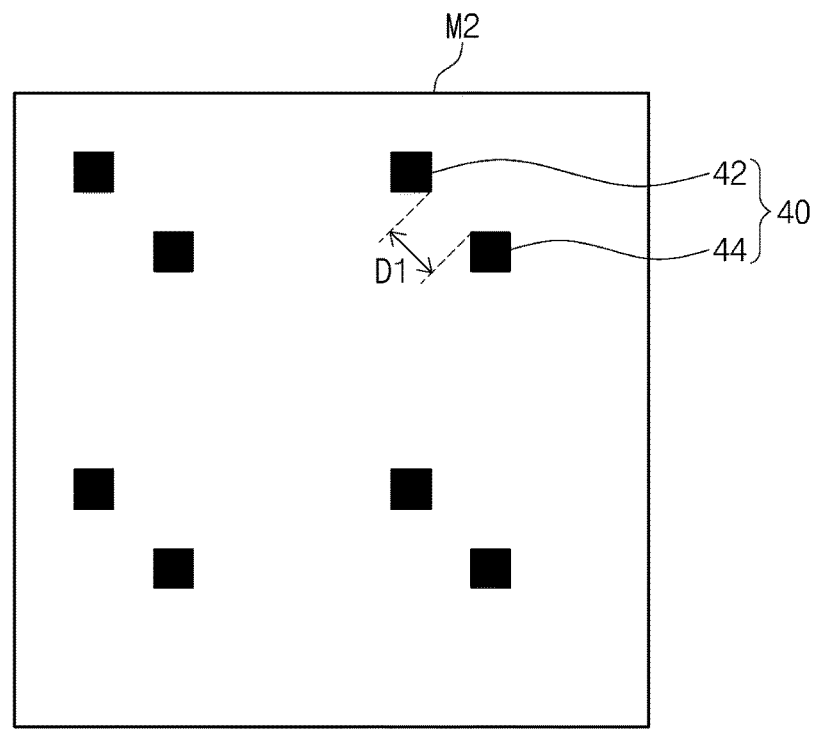
FIG. 5 illustrates a plan view showing an example of a second reticle similar to the first reticle of FIG. 3.
Figure 6:
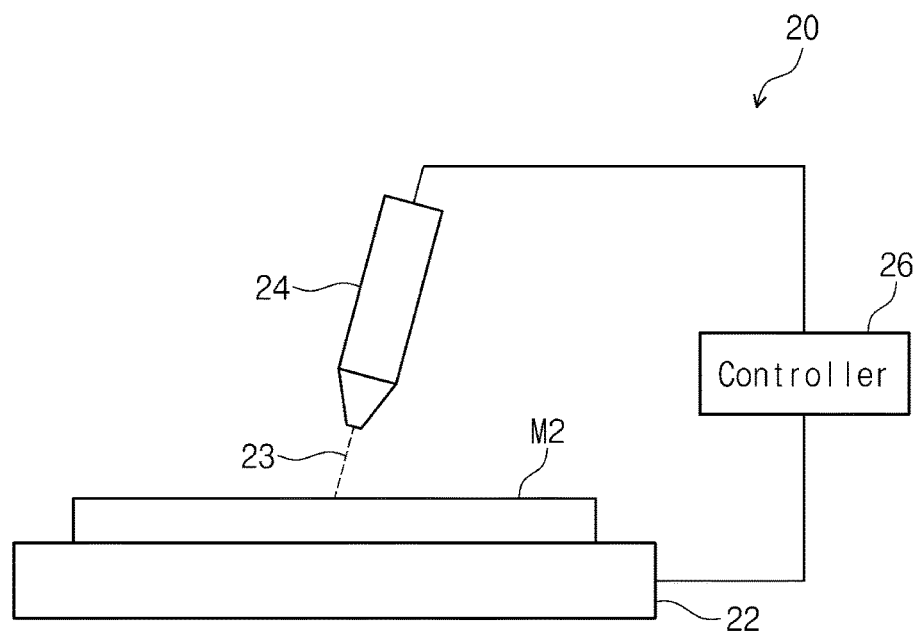
FIG. 6 illustrates a schematic diagram showing a reticle fabrication apparatus for fabricating the second reticle of FIG. 5.

FIG. 5 shows a second reticle M2 similar to the first reticle M1 of FIG. 3. FIG. 6 shows an example of a reticle fabrication apparatus 20 for fabricating the second reticle M2 of FIG. 5.

Referring to FIGS. 1, 5, and 6, the reticle fabrication apparatus 20 may design the second reticle M2 (S30). The reticle fabrication apparatus 20 may be an electron beam lithography apparatus or a laser apparatus. For example, the reticle fabrication apparatus 20 for electron beam lithography may include a second substrate stage 22, an electron gun 24, and a controller 26. The second substrate stage 22 may support the second reticle M2. The electron gun 24 may be disposed above the second substrate stage 22. The electron gun 24 may use an electron beam 23 to pattern the second reticle M2. Alternatively, the reticle fabrication apparatus 20 for laser lithography may use a laser beam to pattern the second reticle M2.

The controller 26 may be connected to the second substrate stage 22 and the electron gun 24. The controller 26 may include a processor or a computer. The controller 26 may control the second substrate stage 22 and the electron gun 24.

The second reticle M2 may be designed similar to the first reticle M1. For example, the second reticle M2 may include second patterns 40. The second patterns 40 may be design patterns. The second patterns 40 may be analogous to the first patterns 30 in terms of shape and position. The second patterns 40 may each have a tetragonal shape. The second patterns 40 may include a first design pattern 42 and a second design pattern 44. For example, each of the second patterns 40 may be either the first design pattern 42 or the second design pattern 44. The first design pattern 42 may be different in shape, size, and/or other parameters when compared to the second design pattern 44. The first design pattern 42 may correspond to the first test pattern 32. The first design pattern 42 may be a second reference pattern. The second design pattern 44 may correspond to the second test pattern 34. The second design pattern 44 may be designed adjacent to the first design pattern 42. The second design pattern 44 may be spaced apart at the first distance D1 from the first design pattern 42.

Referring to FIGS. 1 and 6, based on margins or conditions of a first photolithography process performed by the photolithography apparatus 10, the controller 26 may redesign the second reticle M2 (S40).

Figure 7:
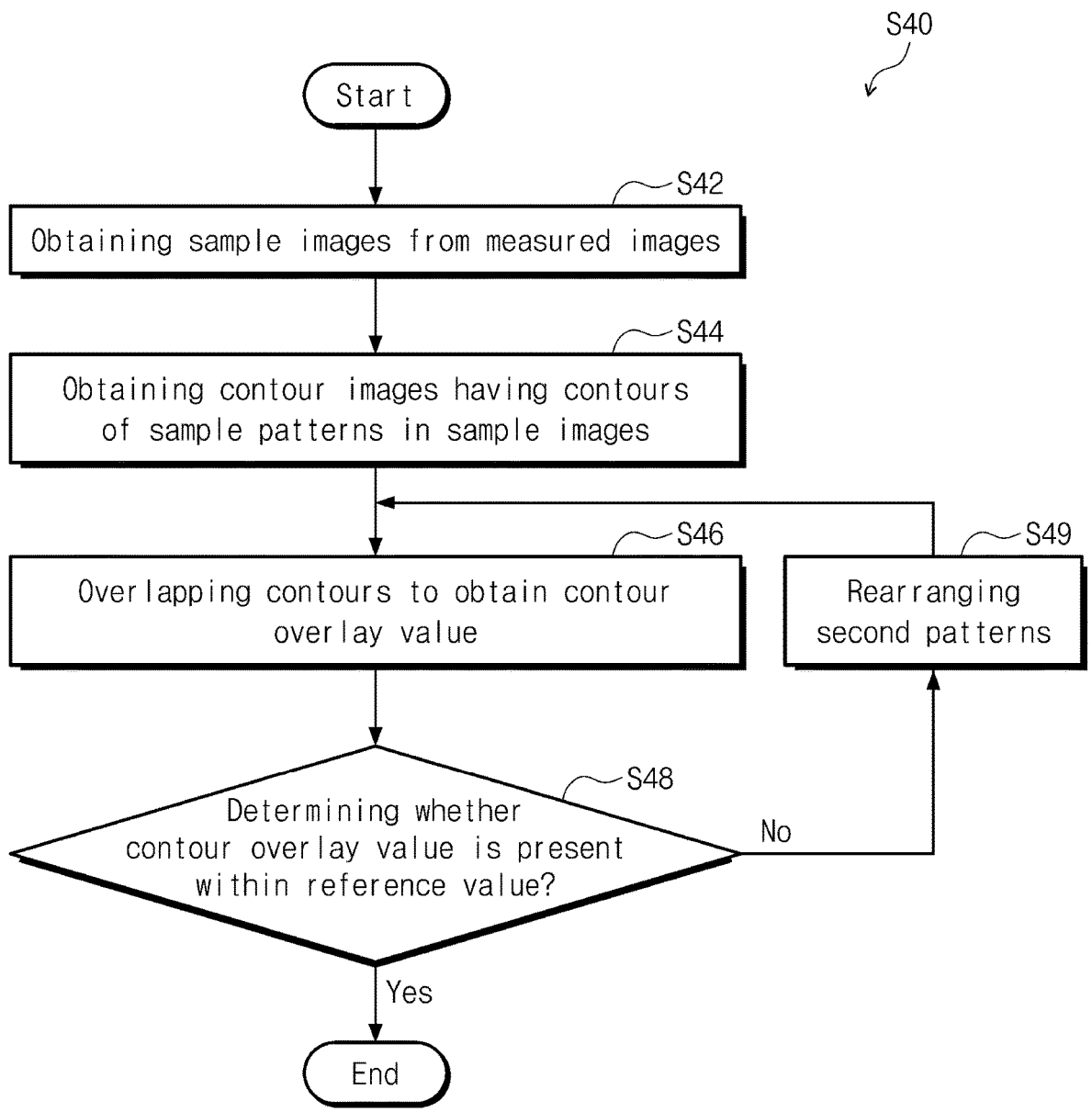
FIG. 7 illustrates a flow chart showing an example for redesigning the second reticle of FIG. 5.
Figure 8:
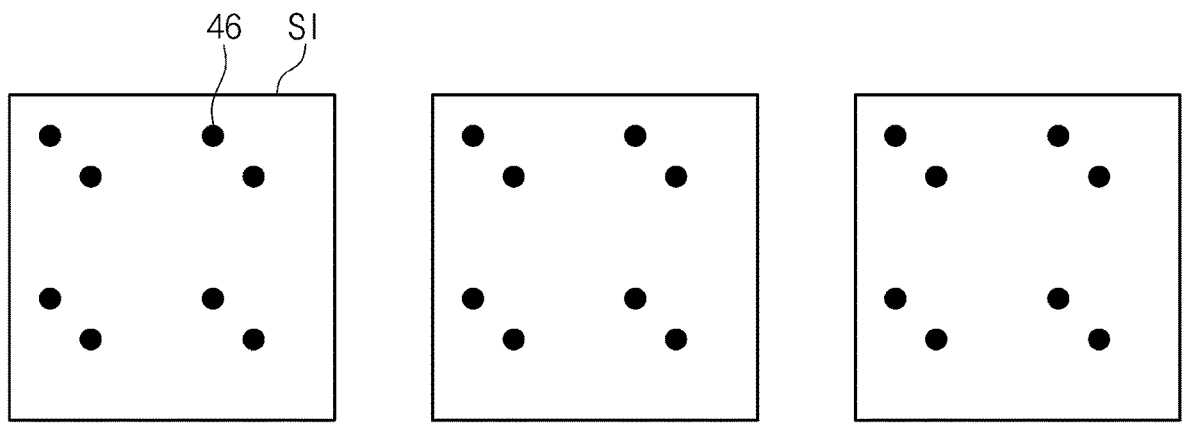
FIG. 8 illustrates sample images obtained from the measured images of FIG. 4.

FIG. 7 shows an example of redesigning the second reticle M2 of FIG. 5. FIG. 8 shows sample images SI obtained from the measured images MI of FIG. 4.

Referring to FIGS. 7 and 8, in accordance with the first patterns 30 being the same as or similar to the second patterns 40 of the second reticle M2, the controller 26 may obtain the sample images SI from the measured images MI (S42). The sample images SI may have second pattern images 46. The second pattern images 46 may be parts of the first pattern images 38.

Figure 9:
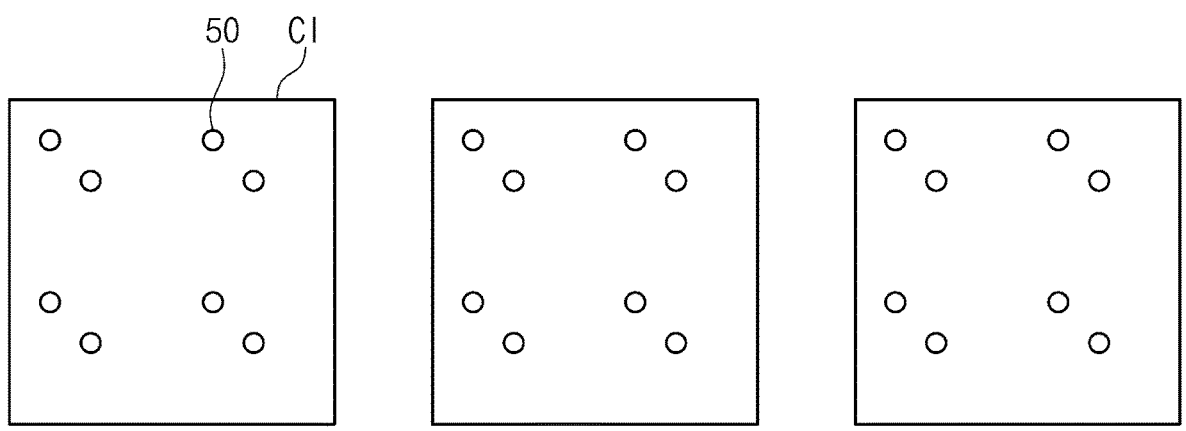
FIG. 9 illustrates contour images obtained from the sample images of FIG. 8.

FIG. 9 shows contour images CI obtained from the sample images SI of FIG. 8.

Referring to FIGS. 7 and 9, the controller 26 may obtain the contour images CI that have contours 50 of the second pattern images 46 in the sample images SI (S44). The contours 50 may be outlines of the second pattern images 46. Since the second pattern images 46 have high dispersion and low uniformity caused by the shot noise of the EUV beam 11, the controller 26 may use the contours 50 of the second pattern images 46 to improve dispersion and uniformity of the second pattern images 46.

The controller 26 may overlap the contours 50 to obtain a contour overlay value (S46). The controller 26 may employ deep learning or machine learning to overlap the contours 50. The contour overlay value may correspond to dispersion or band (e.g., process variation band) of the contours 50. For example, the contour overlay value may include a global overlay value (see 60 of FIG. 11), a group overlay value (see 70 of FIG. 12), and a local overlay value (see 80 of FIG. 13). The controller 26 may overlap the contours 50 to minimize or eliminate defects caused by the shot noise of the EUV beam 11.

The following will describe in detail the global overlay value 60, the group overlay value 70, and the local overlay value 80.

Figure 10:
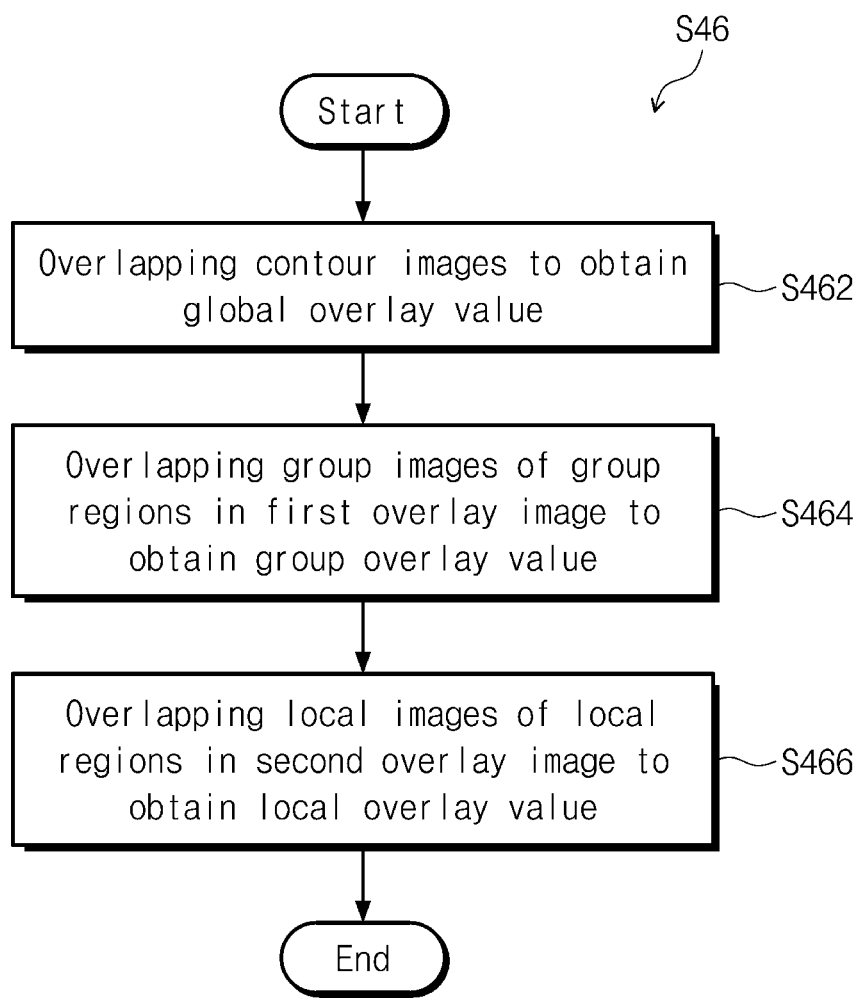
FIG. 10 illustrates a flow chart showing an example of a step for obtaining a contour overlay value by overlapping contours of FIG. 9.
Figure 11:
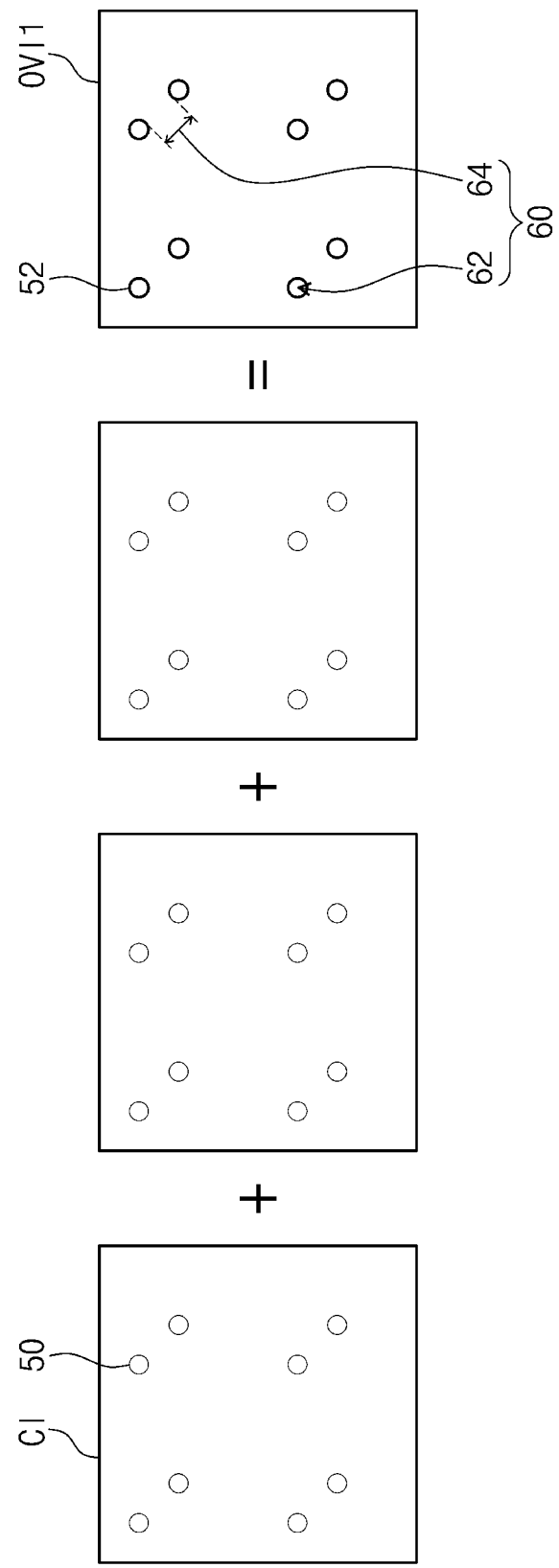
FIGS. 11, 12, and 13 respectively illustrate a global overlay value, a group overlay value, and a local overlay value that are obtained by overlapping contours of FIG. 9.
Figure 12:
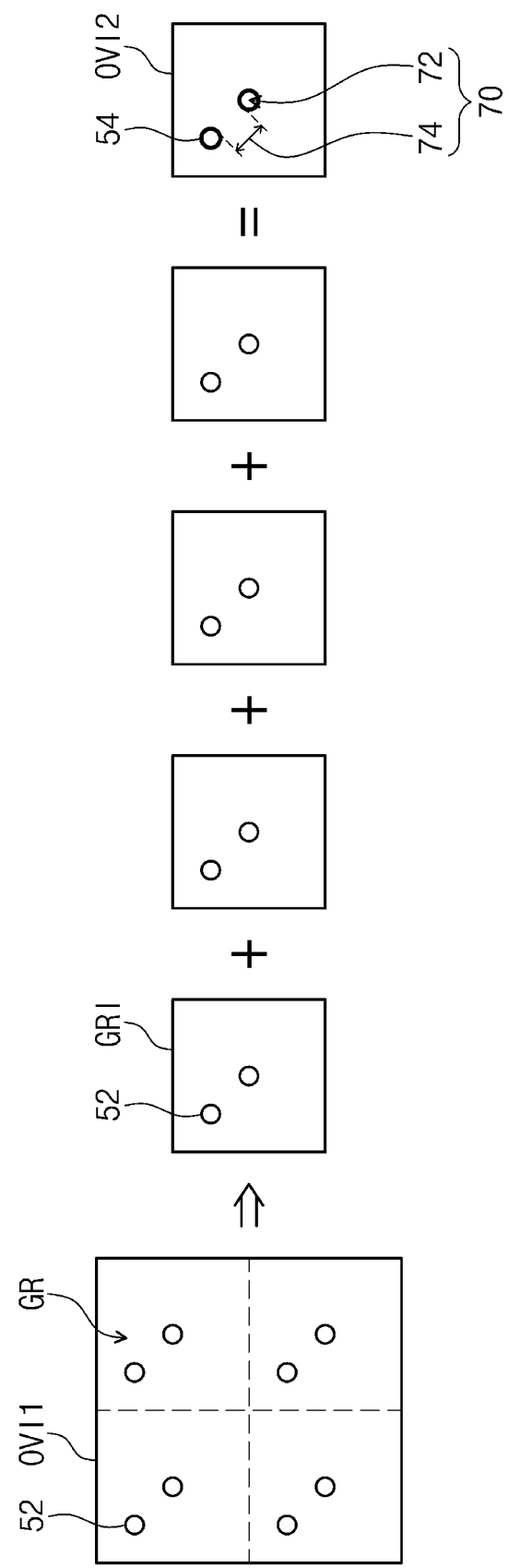
Figure 13:
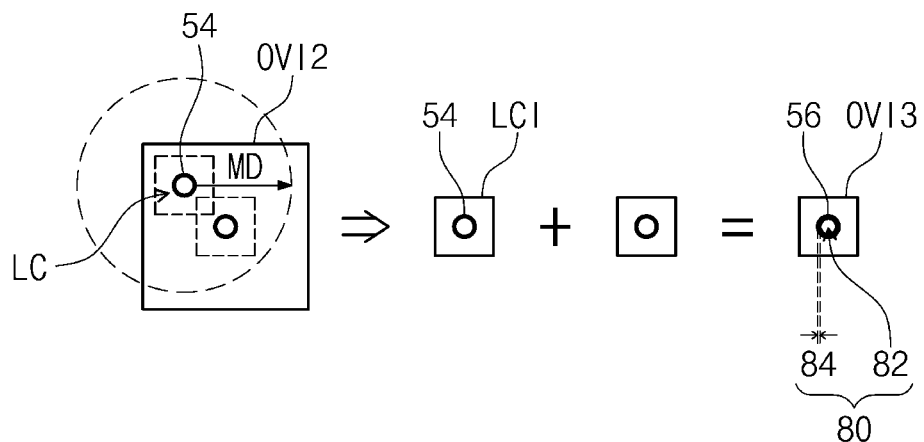

FIG. 10 shows an example of a step for overlapping the contours 50 to obtain the contour overlay value (S46). FIGS. 11, 12, and 13 respectively show the global overlay value 60, the group overlay value 70, and the local overlay value 80 that are obtained from an overlap of the contours 50 in FIG. 9.

Referring to FIGS. 10 and 11, the controller 26 may overlap and/or merge the contour images CI to obtain the global overlay value 60 (S462). The overlapped contour images CI may be produced or combined into a first overlay image OVI1. The first overlay image OVI1 may include first overlapped contours 52. Each of the first overlapped contours 52 may be a pattern image in which the contours 50 overlap each other. The first overlapped contours 52 may have the global overlay value 60. For example, the global overlay value 60 may include a first minimum area value 62 and a first minimum distance value 64. The first minimum area value 62 may correspond to an inner area of each of the first overlapped contours 52. The first minimum distance value 64 may correspond to a distance between a pair of neighboring first overlapped contours 52. The controller 26 may use the first minimum area value 62 and the first minimum distance value 64 to expect a global contour dispersion.

Referring to FIGS. 10 and 12, the controller 26 may overlap group images GRI of group regions GR in the first overlay image OVI1 to obtain the group overlay value 70 (S464). The group regions GR may be defined to refer to repetitive regions in the first overlay image OVI1. The non-limiting example of FIG. 12 illustrates four group regions GR that are separated in four overlapped group images GRI. The overlapped group images GRI may be expressed into a second overlay image OVI2. For example, the first overlay image OVI1 may be divided into a plurality of group images GRI based on the repetitive regions of the first overlapped contours 52, and the plurality of group images GRI may overlap each other to generate the second overlay image OVI2. The second overlay image OVI2 may include second overlapped contours 54. The second overlapped contours 54 may have the group overlay value 70. For example, the group overlay value 70 may include a second minimum area value 72 and a second minimum distance value 74. The second minimum area value 72 may correspond to selecting a minimum of an inner area of each of the second overlapped contours 54. The second minimum distance value 74 may correspond to a distance between a pair of neighboring second overlapped contours 54. The controller 26 may use the second minimum area value 72 and the second minimum distance value 74 to expect a group contour dispersion.

Referring to FIGS. 10 and 13, the controller 26 may overlap local images LCI of local regions LC in the second overlay image OVI2 to obtain the local overlay value 80 (S466). The local region LC may be defined to refer to a region within a modeling distance MD from the second overlapped contour 54. The modeling distance MD may be determined by a wavelength of the EUV beam 11 and performance (e.g., the number of aperture (NA)) of the optical system 16 of FIG. 2. For example, the modeling distance MD may be about 300 nm.

Figure 14:
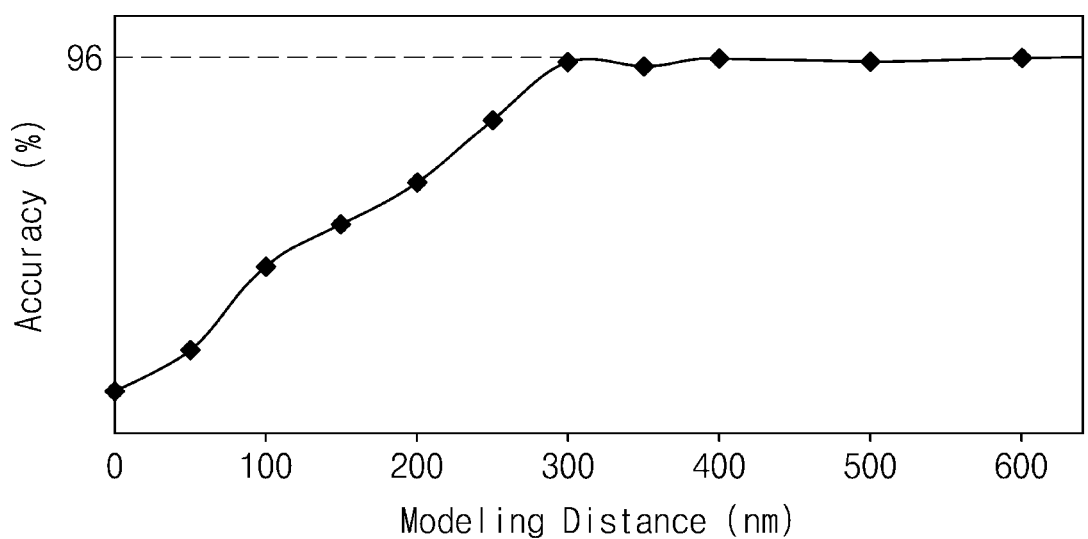
FIG. 14 illustrates a graph showing accuracy dependent on modeling distance.

FIG. 14 shows accuracy dependent on the modeling distance MD of FIG. 13.

Referring to FIG. 14, as a non-limiting example, when the modeling distance MD is greater than about 300 nm, the accuracy may become greater than about 96%. When the modeling distance MD exceeds about 300 nm, a modeling run time may increase and productivity may decrease. Therefore, the controller 26 may use the modeling distance MD of about 300 nm to obtain the local overlay value 80 and the local images LCI whose accuracy and productivity are high.

Referring back to FIG. 13, the second overlay image OVI2 within the modeling distance MD may be divided into the local images LCI. The local images LCI may be images having the second overlapped contours 54 that are symmetrically arranged. The divided local images LCI may overlap each other. The overlapped local images LCI may be expressed into a third overlay image OVI3. The third overlay image OVI3 may include a third overlapped contour 56. In some embodiments, the third overlapped contour 56 may be obtained by overlapping the second overlapped contours 54 that are symmetrically arranged within the modeling distance MD. The third overlapped contour 56 may have the local overlay value 80. The local overlay value 80 may include a third minimum area value 82 and a critical dimension value 84. The third minimum area value 82 may correspond to an inner area of the third overlapped contour 56. The critical dimension value 84 may correspond to a half of a difference between inside and outside diameters of the third overlapped contour 56. The controller 26 may use the third minimum area value 82 and the critical dimension value 84 to expect a local contour dispersion.

Figure 15:
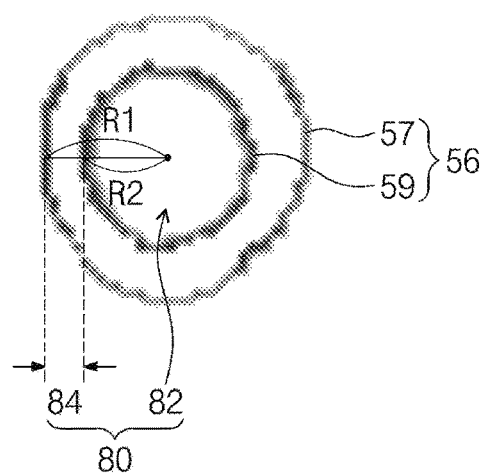
FIG. 15 illustrates a plan view showing an example of a third overlapped contour in FIG. 13.

FIG. 15 shows an example of the third overlapped contour 56 in FIG. 13.

Referring to FIG. 15, the third overlapped contour 56 may have an outer contour 57 and an inner contour 59. The outer contour 57 may be an outline of the third overlapped contour 56. The inner contour 59 may be an inner line of the third overlapped contour 56. The third minimum area value 82 may correspond to an inner area of the inner contour 59. The critical dimension value 84 may correspond to a difference between a first radius R1 of the outer contour 57 and a second radius R2 of the inner contour 59.

Referring back to FIG. 7, the controller 26 may compare the global, group, and local overlay values 60, 70, and 80 of the contour overlay value with reference values to determine whether the second patterns 40 have defects (S48). For example, the controller 26 may determine whether the global, group, and local overlay values 60, 70, and 80 of the contour overlay value are present within the reference values. The reference values may include a reference area value, a reference distance value, and/or a reference critical dimension value.

When one or more of the first, second, and third minimum area values 62, 72, and 82 are less than the reference area value, the second patterns 40 may be determined to have defects. Conversely, if the first, second, and third minimum area values 62, 72, and 82 are greater than the reference area value, the second patterns 40 may be determined to be acceptable as not having defects. At least one of the second patterns 40 may be expected to have small contact defects or not-open defects. For example, the reference area value may be about 15 nm$^2$, but the present inventive concepts are not limited thereto. When the first minimum distance value 64 or the second minimum distance value 74 is less than the reference distance value, the second patterns 40 may be determined to have defects. At least one of the second patterns 40 may be expected to have bridge defects. The reference distance value may be about 10 nm, but the present inventive concepts are not limited thereto. When the critical dimension value 84 is greater than the reference critical dimension value, the second patterns 40 may be determined to have defects. The reference critical dimension value may be about 5 nm, but the present inventive concepts are not limited thereto.

When the second patterns 40 are determined to have defects, the controller 26 may rearrange the second patterns 40 on the second reticle M2 (S49). Accordingly, the controller 26 may prevent or minimize defects of the second patterns 40.

Figure 16:
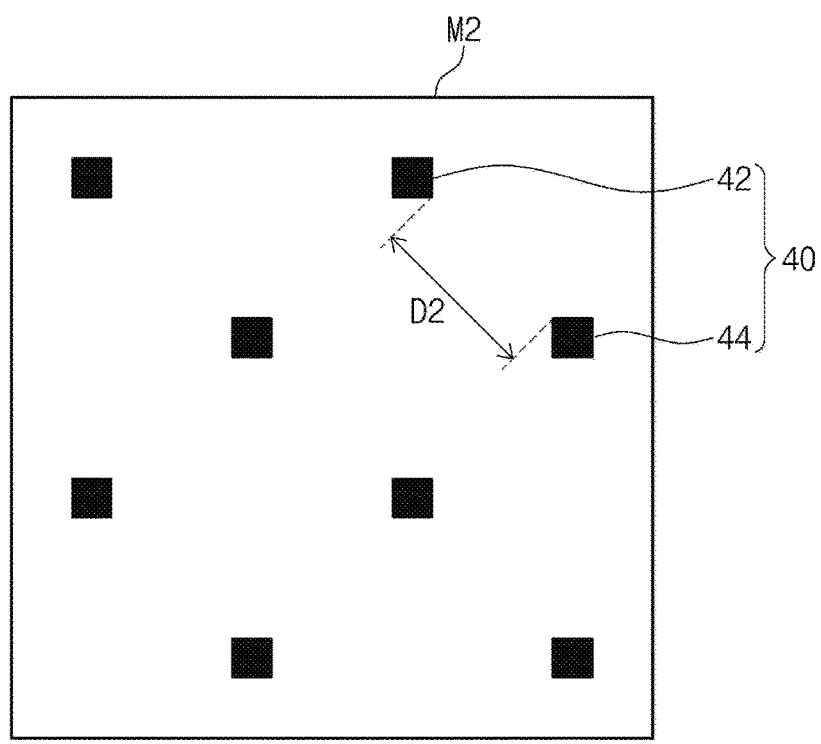
FIG. 16 illustrates a plan view showing an example of second patterns rearranged on the second reticle of FIG. 6.

FIG. 16 shows an example of the second patterns 40 rearranged on the second reticle M2 of FIG. 6.

Referring to FIG. 16, a variation in distance may be provided between the first and second design patterns 42 and 44 of the second pattern 40. For example, the second design pattern 44 may be rearranged within the second distance D2 from the first design pattern 42. The second design pattern 44 may correspond to the third test pattern 36. The second distance D2 may be greater the first distance D1. Afterwards, the controller 26 may perform the steps S42, S44, S46, and S48 on the second patterns 40 to determine whether the second reticle M2 has defects.

Referring back to FIGS. 1 and 7, when the global, group, and local overlay values 60, 70, and 80 of the contour overlay value are present within the reference values, the reticle fabrication apparatus 20 may manufacture the second reticle M2 (S50). The electron gun 24 of FIG. 6 may provide the second reticle M2 with the electron beam 23 to pattern the second reticle M2. In some embodiments, a laser beam may be used to fabricate the second reticle M2.

The photolithography apparatus 10 may form a photoresist pattern on a substrate using the second reticle M2 to perform a second photolithography process (S60). For example, the second photolithography process may include the EUV exposure process.

An etching apparatus may use the photoresist pattern as an etching mask to etch the substrate (S70). A dry etching process may be performed to etch the substrate. In some embodiments, a wet etching process may be performed to etch the substrate.

As discussed above, a reticle fabrication method may obtain contours of sample patterns and may overlap each other to eliminate or minimize defects caused by shot noises of an extreme ultraviolet (EUV) beam.

Although the present inventive concepts have been described in connection with the embodiments of the present inventive concepts illustrated in the accompanying drawings, it will be understood to those skilled in the art that various changes and modifications may be made without departing from the scope of the present inventive concepts. It therefore will be understood that the embodiments described above are just illustrative but not limitative in some or all aspects.

What is claimed is:

1. A reticle fabrication method, comprising:
performing a photolithography process on a test substrate using a first reticle comprising first patterns;
measuring the test substrate to obtain measured images;
designing a second reticle comprising second patterns;
redesigning the second reticle based on a margin of the photolithography process to determine a redesigned second reticle; and
manufacturing the redesigned second reticle,
wherein redesigning the second reticle comprises:
obtaining sample images from the measured images, when the first patterns are same as the second patterns;
obtaining contour images that have contours of sample patterns in the sample images;
overlapping the contours of the contour images and combining the overlapped contour images into a first overlay image having a plurality of first overlapped contours;
overlapping a plurality of group images of a plurality of group regions in the first overlay image to obtain a second overlay image smaller than the first overlay image, the second overlay image including a plurality of second overlapped contours less than the first overlapped contours; and
overlapping a plurality of local images of a plurality of local regions in the second overlay image to obtain a third overlay image smaller than the second overlay image, the third overlay image including a third overlapped contour which has a critical dimension value corresponding to a difference between an inner and outer diameter of the third overlapped contour.

2. The reticle fabrication method of claim 1, wherein redesigning the second reticle further comprises:
    overlapping the contours to obtain a contour overlay value; and
    comparing the contour overlay value with a reference value to determine whether defects of the second patterns are present,
    wherein overlapping the contours to obtain the contour overlay value comprises overlapping the contour images to obtain a global overlay value of overlapped contour images.

3. The reticle fabrication method of claim 2, wherein the first overlay image has first overlapped contours, and wherein the global overlay value comprises:
    a first minimum area value among inner areas of respective ones of the first overlapped contours; and
    a first minimum distance value between a pair of neighboring first overlapped contours.

4. The reticle fabrication method of claim 2,
    wherein overlapping the contours to obtain the contour overlay value further comprises overlapping local images of a plurality of local regions in the second overlay image to obtain a local overlay value.

5. The reticle fabrication method of claim 4, wherein the second overlay image has second overlapped contours, and wherein the local overlay value comprises:
    a second minimum area value among inner areas of respective ones of the second overlapped contours; and
    a second minimum distance value between a pair of neighboring second overlapped contours.

6. The reticle fabrication method of claim 5,
    wherein a local region of the plurality of local regions is defined within a modeling distance from one of the second overlapped contours in the second overlay image, and
    wherein the modeling distance is about 300 nm.

7. The reticle fabrication method of claim 4,
    wherein the overlapped local images are combined into a third overlay image,
    wherein the third overlay image has a third overlapped contour, and
    wherein the local overlay value comprises a third minimum area value of the third overlapped contour.

8. The reticle fabrication method of claim 7, wherein the third overlapped contour comprises:
    an outer contour; and
    an inner contour within a boundary of the outer contour,
    wherein the local overlay value further comprises a critical dimension value that corresponds to a difference between a first radius of the outer contour and a second radius of the inner contour.

9. The reticle fabrication method of claim 1, wherein redesigning the second reticle further comprises rearranging the second patterns when defects of the second patterns are present.

10. The reticle fabrication method of claim 1, further comprising:
    overlapping ones of the plurality of group images with each other to generate the second overlay image,
    wherein the plurality of group regions comprise repetitive regions in the first overlay image.

11. The reticle fabrication method of claim 10, wherein overlapping the plurality of local images of the plurality of local regions in the second overlay image to obtain the third overlay image comprises:
    dividing the second overlay image into the plurality of local images with contours that are symmetrically arranged; and
    overlapping ones of the plurality of local images to generate the third overlay image.

12. A reticle fabrication method, comprising:
    performing a photolithography process on a test substrate using a first reticle comprising first patterns;
    measuring the test substrate to obtain measured images;
    designing a second reticle comprising second patterns; and
    redesigning the second reticle based on a margin of the photolithography process to determine a redesigned second reticle,
    wherein redesigning the second reticle comprises:
        obtaining sample images from the measured images when the first patterns are same as the second patterns;
        obtaining contour images that have contours of sample patterns in the sample images;
        overlapping the contours of the contour images and combining the overlapped contour images into a first overlay image having a plurality of first overlapped contours;
        overlapping a plurality of group images of a plurality of group regions in the first overlay image to obtain a second overlay image smaller than the first overlay image, the second overlay image including a plurality of second overlapped contours less than the first overlapped contours; and
        overlapping a plurality of local images of a plurality of local regions in the second overlay image to obtain a third overlay image smaller than the second overlay image, the third overlay image including a third overlapped contour which has a critical dimension value corresponding to a difference between an inner and outer diameter of the third overlapped contour.

13. The reticle fabrication method of claim 12, wherein redesigning the second reticle further comprises:
    overlapping the contour images to obtain a global overlay value,
    wherein the method further comprises overlapping group images of a plurality of group regions in the first overlay image to obtain a group overlay value.

14. The reticle fabrication method of claim 13,
    wherein the method further comprises overlapping local images of a plurality of local regions in the second overlay image to obtain a local overlay value.

15. The reticle fabrication method of claim 14,
    wherein the third overlay image comprises a third overlapped contour, and
    wherein the local overlay value comprises a minimum area value that corresponds to an inner area of the third overlapped contour.

16. The reticle fabrication method of claim 15, wherein the third overlapped contour comprises:
    an outer contour; and
    an inner contour within a boundary of the outer contour,
    wherein the local overlay value further comprises a critical dimension value that corresponds to a difference between a first radius of the outer contour and a second radius of the inner contour.

17. A semiconductor device fabrication method, comprising:
    performing a first photolithography process on a test substrate using a first reticle comprising first patterns;
    measuring the test substrate to obtain measured images;

designing a second reticle comprising second patterns;
redesigning the second reticle based on a margin of the first photolithography process to determine a redesigned second reticle;
manufacturing the redesigned second reticle; and
performing a second photolithography process on the test substrate using the redesigned second reticle,
wherein redesigning the second reticle comprises:
    obtaining sample images from the measured images when the first patterns are same as the second patterns;
    obtaining contour images that have contours of sample patterns in the sample images;
    overlapping the contours of the contour images and combining the overlapped contour images into a first overlay image having a plurality of first overlapped contours;
    overlapping a plurality of group images of a plurality of group regions in the first overlay image to obtain a second overlay image smaller than the first overlay image, the second overlay image including a plurality of second overlapped contours less than the first overlapped contours;
    overlapping a plurality of local images of a plurality of local regions in the second overlay image to obtain a third overlay image smaller than the second overlay image, the third overlay image including a third overlapped contour which has a critical dimension value corresponding to a difference between an inner and outer diameter of the third overlapped contour;
    overlapping the contours to obtain a contour overlay value; and
    comparing the contour overlay value with a reference value to determine whether defects of the second patterns are present.

18. The semiconductor device fabrication method of claim 17, wherein each of the first and second photolithography processes comprises an extreme ultraviolet (EUV) exposure process.

19. The semiconductor device fabrication method of claim 17, wherein the contours are overlapped with each other by deep learning or machine learning.

20. The semiconductor device fabrication method of claim 19, wherein the contour overlay value comprises a minimum area value among inner areas of respective ones of the overlapped contours.

21. The semiconductor device fabrication method of claim 17, further comprising:
    forming a photoresist pattern on the substrate based on using the redesigned second reticle to perform the second photolithography process; and
    etching the substrate using the photoresist pattern as an etching mask.

\* \* \* \* \*